United States Patent [19]

Palara et al.

[11] Patent Number: 5,712,776
[45] Date of Patent: Jan. 27, 1998

[54] STARTING CIRCUIT AND METHOD FOR STARTING A MOS TRANSISTOR

[75] Inventors: Sergio Palara, Acitrezza; Vito Graziano, Palermo, both of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 688,296

[22] Filed: Jul. 30, 1996

[30] Foreign Application Priority Data

Jul. 31, 1995 [EP] European Pat. Off. ............ 95830340

[51] Int. Cl.$^6$ ............................................. H02M 7/122
[52] U.S. Cl. ............................ 363/49; 363/56; 315/307
[58] Field of Search .............................. 363/49, 17, 37, 363/56, 132, 98; 315/205, 307

[56] References Cited

U.S. PATENT DOCUMENTS

| | | | |
|---|---|---|---|
| 4,390,937 | 6/1983 | Clark, Jr. | 363/22 |
| 4,631,652 | 12/1986 | Wendt | 363/16 |
| 4,745,537 | 5/1988 | Cheung | 363/37 |
| 5,303,140 | 4/1994 | Shimizu | 363/132 |

*Primary Examiner*—Peter S. Wong
*Assistant Examiner*—Shawn Riley
*Attorney, Agent, or Firm*—Wolf, Greenfield & Sacks, P.C.; James H. Morris

[57] ABSTRACT

A start up circuit causes a MOS transistor to be turned on by sensing local electrical quantities thereof, specifically the potential at the drain terminal of the MOS transistor. A small current is injected into the control terminal of the MOS transistor when the potential at the drain terminal is high. For the purpose, an electric network is arranged to couple these two terminals together.

62 Claims, 4 Drawing Sheets

STARTING CIRCUIT AND METHOD FOR STARTING A MOS TRANSISTOR

BACKGROUND OF THE INVENTION

1. Field of the Invention

This invention relates to a start up circuit for use with MOS transistors, a MOS transistor provided with such a circuit, and applications of both.

2. Discussion of the Related Art

There are circuit arrangements in which, at initial or renewed power-on, the system is in a stable initial state in which both the transistors are in a cut-off state due to the stable initial state of the driver circuit of its control terminal. In these situations it matters that a transistor be made to conduct immediately. The following change of the drain voltage causes the correct desired system operation.

This is the situation with self-oscillating bridge converters, for example, as used in driver arrangements for fluorescent lamps such as that depicted in the accompanying FIG. 1.

The driver system of FIG. 1 is a traditional one having two input terminals AC1 and AC2 for a mains supply, e.g. at 220 Volts and 50 Hertz in many European countries, and 110 Volts and 60 Hertz in the United States, and comprises a bridge rectifier BR coupled to the terminals AC1 and AC2, filtering circuitry FT coupled to the output of the bridge BR for suppressing the AC component residue, and self-oscillating half-bridge circuitry for driving a fluorescent lamp LA which is coupled to the output terminals, VDD and GND, of the circuitry FT, with the terminal VDD functioning as a supply potential reference and the terminal GND as a ground potential reference. A fuse FS and/or a resistor RES may be connected between the terminals AC1 and AC2, on the one side, and the bridge BR on the other, for protection purposes.

The load on the half-bridge circuitry is comprised of a primary winding B3 of a transformer, an inductor L1, and the lamp LA, connected in series. A first terminal of this connection is coupled to the output of the half-bridge, and a second terminal is connected to the intermediate tap of a first capacitive divider; this first divider being connected between the terminal VDD and the terminal GND and comprising two capacitors, C3 and C4. Connected in parallel with the lamp LA is a second capacitive divider comprising two capacitors, C1 and C2. The intermediate tap of this second divider is connected, through a thermistor PTC coupled to the lamp LA, to the intermediate tap of a serial connection of two diodes, DP1 and DP2. The anode of the diode DP2 is connected to the terminal GND, the cathode of the diode DP2 to the anode of the diode DP1, and the cathode of the diode DP1 to the terminal VDD.

The half-bridge circuitry comprises a first power transistor M1 of the MOS type and a second power transistor M2, also of the MOS type, which have main conduction paths connected in series between the terminal VDD and the terminal GND. Each MOS power transistor has a driver circuit connected between its control and source terminals. The transistor M1 is coupled to a first driver circuit NT1 which has an input connected to a first secondary winding B1 of a transformer. The transistor M2 is coupled to a second driver circuit NT2, being identical with the circuit NT1, which has an input connected to a second secondary winding B2 of a transformer; the windings B1, B2, B3 belonging to the same transformer, and the windings B1 and B2 being substantially similar and connected to the respective driver circuits to supply them with voltages in phase opposition.

Associated with the half-bridge circuitry is start-up circuitry comprising a resistor RS and capacitor CS, connected in series between the terminals VDD and GND, a diode DS of the junction type which has its anode connected to the intermediate tap of that series connection and its cathode to the source terminal of the transistor M1, a diode DD of the DIAC type which has a first terminal connected to the intermediate tap of that series connection and a second terminal to the control terminal of the transistor M2, and a resistor RR connected in parallel with the main conduction path of the transistor M1. At system power-on, the control terminals of the transistors M1 and M2 are at zero potential and the capacitor CS begins to be charged. The diode DS will not be conducting because its cathode is at a very high potential due to the resistor RR provided. Upon the voltage across the capacitor CS exceeding the breakdown voltage of the diode DD, the transistor M2 begins to conduct and operation in the oscillating mode sets in.

A prior art driver circuit is illustrated by the accompanying FIG. 2 and comprises a resistor R0 which has a first terminal connected to a terminal G and a second terminal connected to a node A, a capacitor C0 which has a first terminal connected to a terminal S and a second terminal connected to the node A, a diode D0 which has its anode connected to the node A and its cathode connected to the control terminal of the MOS transistor (transistor M2 in FIG. 2) to be driven, and a bipolar transistor TR0 of the PNP type which has its emitter connected to the control terminal of the MOS transistor, its collector connected to the terminal S, and its base connected to the node A via a resistor RB; also provided is a diode D6 of the Zener type for protecting the MOS transistor against overvoltages. Also shown in FIG. 2 for clarity are the transistor M2, having its drain terminal connected to a terminal D and source terminal to the terminal S, and a diode DD, having a terminal connected to the control terminal of the transistor M2, although these parts do not belong, strictly speaking, to the driver circuit DR.

It matters that the two transistors are not turned on simultaneously to avoid the connection of the terminal VDD to the terminal GND which causes a huge flow of current through the two transistors M1 and M2—these transistors forming a conduction path of very low impedance—which is apt to inflict damage on them from overcurrent. Also important is to avoid, during normal operation when both transistors M1 and M2 are simultaneously off, too long a current re-circulation time through the re-circulating diodes, inherently present between the drain and the source terminals of MOS power transistors; dissipation through such diodes can be quite high, in fact.

The driver circuit of FIG. 2 is effective to turn on and off the MOS transistor connected to it at appropriate times; that is, the driver circuit of the transistor M1 should only turn it on after the driver circuit of the transistor M2 has turned it off, and vice versa. As is well recognized, the on and off states of the transistors M1 and M2 depend on the potential difference between the control and source terminals, and on their threshold voltage.

Delayed turn-on is provided by the phase shift introduced by the phase shifter consisting of the resistor R0 and the capacitor C0, although an accurate computation ought to also take account of the intrinsic capacitance which exists between the control and source terminals of the MOS transistor. The advanced turning-off is provided by turning on the transistor TR0, which would occur upon the voltage across the capacitor C0 dropping by some 1.4 Volts below its maximum value consequently to the capacitor C0 being discharged through the resistor R0.

In a driver circuit as outlined above, the circuit components must be accurately sized to ensure utmost likeness in the performance of the various drivers, even with changing temperatures, for example. This likeness should be adequate to keep the duty cycle very close to fifty percent, and should prevent so-called "cross-conduction". In addition, the circuit is unsuitable for integration, particularly on account of the capacitor C0 therein.

In general, as well as in the converter of FIG. 1, the start-up condition is sensed by a suitable start up circuit directly connected to the power supply. At power-on, the start up circuit causes current to flow into the control terminal of one of the two MOS transistors and turn on the transistor, whereas in the steady state, the start up circuit has negligible or no effect.

Such start up circuits are usually selected to suit their intended application, require circuit elements with storage capabilities, usually capacitors, and are difficult to integrate to the MOS-type transistor, due both to design diversity of the circuits, the presence of the capacitors, and the inherent circuit spread-out.

SUMMARY OF THE INVENTION

It is an object of this invention to provide a start up circuit for MOS transistors which can obviate the drawbacks of prior art.

An embodiment of the invention is directed to a start up circuit for a MOS transistor having a drain terminal and a control terminal, the start up circuit comprising an electric network adapted to couple the drain terminal of the MOS transistor to the control terminal of the MOS transistor. The electric network may include a resistive divider having a first end terminal coupled to the drain terminal of the MOS transistor and an intermediate tap coupled to the control terminal of the MOS transistor. The resistive divider may further include a second end terminal coupled to the source terminal of the MOS transistor, and at least one unidirectional conduction circuit element adapted to make a flow of current unidirectional with respect to the drain terminal.

The invention further concerns a novel transistor of the MOS type comprising the start up function at power-on, a self-oscillating bridge converter, and a driver arrangement for glow lamps whereto this transistor can be advantageously applied.

The invention can be better appreciated from the following description, when read in conjunction with the accompanying drawings, in which:

DETAILED DESCRIPTION

As pointed out in the introduction, the circuitry encompassed by a prior art self-oscillating bridge converter is fairly complex and hardly integratable.

An embodiment of this invention is directed to simplify that circuitry, specifically in the respect of the power devices which comprise the bridge. This has been achieved by providing a novel type of MOS transistor, such as that shown in FIG. 3, which is endowed with unique features. It should be understood, however, that this novel transistor type may be used wherever useful.

Figure 3:
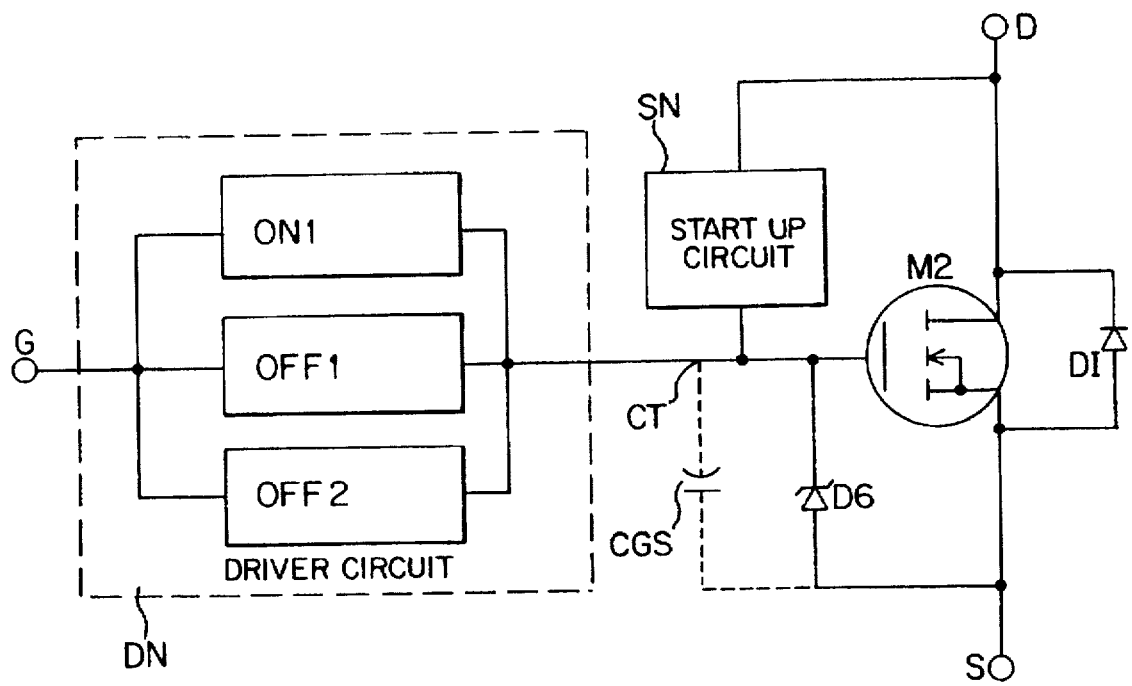
FIG. 3 is a combined block diagram of a driver circuit and a start up circuit according to an embodiment of this invention.

The transistor of FIG. 3 has three terminals only, as denoted by the characters G, S, D, and comprises a transistor M2 of the MOS type having a drain terminal connected to the terminal D, a source terminal connected to the terminal S, and a control terminal CT "coupled" to the terminal G.

In parallel with a main conduction path of the transistor M2, there is an intrinsic diode D1. This diode D1 functions to recirculate the current while the transistor M2 is in its off state, as is often the case with these inductive load applications. It is on this account that it has come to be known as the "re-circulating" diode. Advantageously connected between the control and source terminals of the transistor M2 is a diode D6 of the Zener type serving a transistor protection function, as is often done with these applications. Also shown is a capacitor CGS, in phantom lines to indicate that this capacitor is intrinsic to the transistor M2. In addition, two blocks are shown: the start up circuit SN and driver circuit DN.

The start up circuit SN couples the drain terminal of the transistor M2 to its control terminal.

The driver circuit DN couples the control terminal of the transistor M2 to the terminal G. As shown in FIG. 3, the circuit DN is comprised of three sub-circuits: a turn-on delay circuit ON1, a first turn-off circuit OFF1, and a second turn-off circuit OFF2.

What has been described in connection with the transistor M2 and FIG. 3 also applies to the transistor M1 and any other MOS transistor, including non-power and N- and P-channel ones.

The above sub-circuits will now be described in greater detail with reference to FIG. 4.

A principle on which an embodiment of the start up circuit of this invention operates is that of having the MOS transistor turned on by sensing local electrical quantities thereof, specifically the potential at the drain terminal of the MOS transistor.

The basic idea, in one embodiment of this invention, is one of injecting a small current into the control terminal when the drain terminal potential is high. For the purpose, an electric network is provided to couple both terminals together. In the embodiment of FIG. 4, the electric network comprises resistors R1, R2, R7 and diodes D4, D5.

It will be appreciated that the electric network may be embodied with varying degrees of complexity, using passive and/or active components. One embodiment includes a resistor with a suitable value.

Since for the specific application of driver arrangements to fluorescent lamps the drain terminal potential of MOS transistors is to attain very high values, e.g. in excess of 300 Volts, compared to the threshold voltage, which may be 2.5 Volts, a resistive divider may be used, which is simple and avoids excessively large current injections.

The divider may include a series coupling of resistors R7, R2 and R1, it being allowed to regard the series connection of the resistors R1 and R2 as a single resistor for the purposes of the start up circuit. A first end terminal, corresponding to a terminal of the resistor R7, is connected to the drain terminal of the MOS transistor. An intermediate tap, corresponding to a node included between the resistor R7 and the resistor R2, is coupled to the control terminal of the MOS transistor.

The second end terminal of the divider, corresponding to a terminal of the resistor R1, admits of at least two alternative connections.

A first possibility is to connect the second end terminal to the source terminal of the MOS transistor.

A second possibility is that of having the second end terminal connected to the terminal G, when the second terminal would function as the control terminal of the novel MOS transistor. In this case, the injected current would not only be dependent on the potential at the terminal D but also on the potential at the terminal G.

Figure 4:
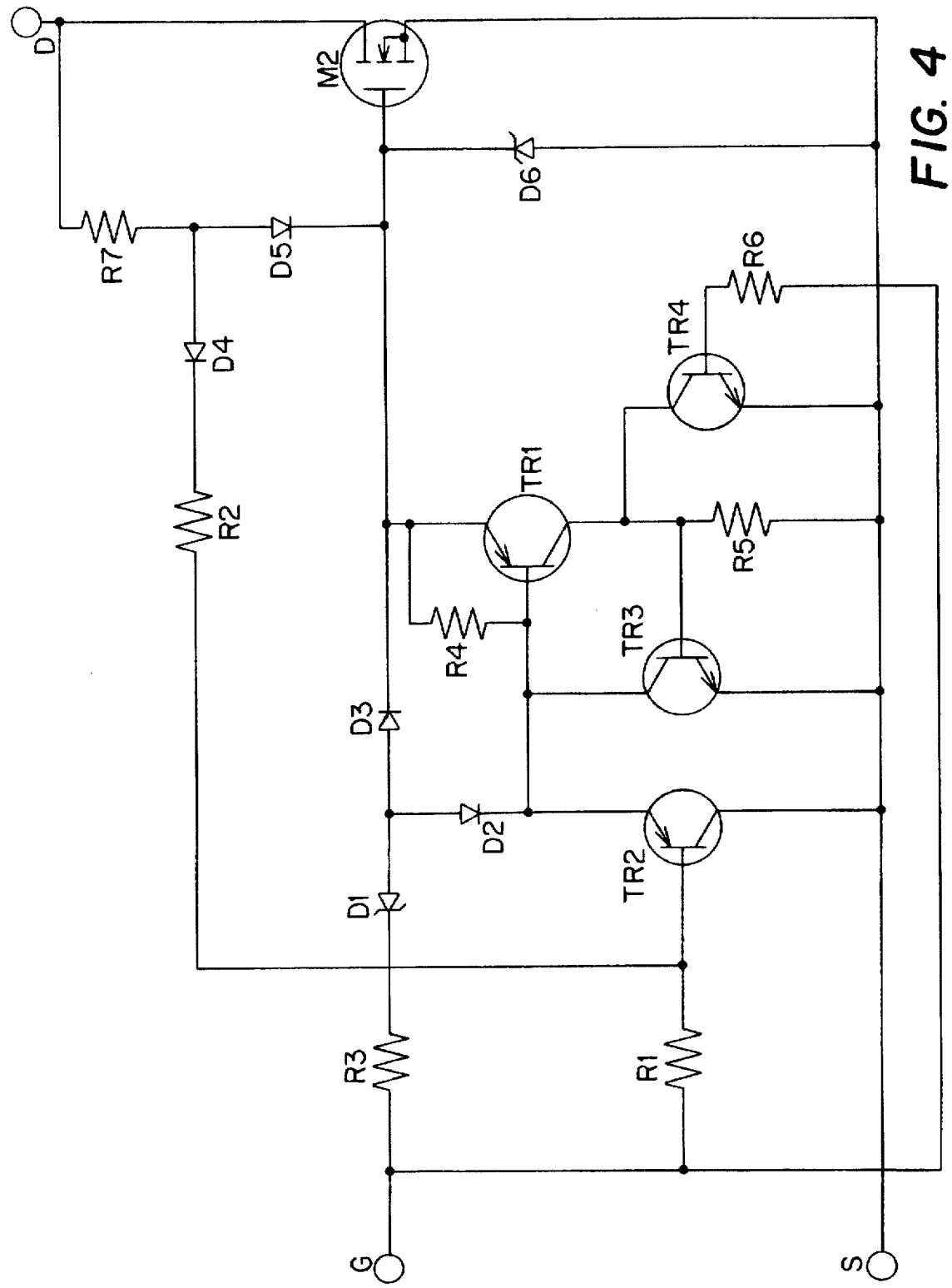
FIG. 4 is a combined circuit diagram of a driver circuit and a start up circuit according to an embodiment of this invention.

Inserted in the circuit of FIG. 4 are unidirectional conduction circuit elements, in the form of diodes D4 and D5, which limit the steady state effects of the start up circuit SN. Thus, the divider may operate in the unidirectional mode only, this being a useful choice in itself as well as where the start up circuit is associated with a driver circuit, as is the case in FIG. 4.

The diode D5, connecting the control terminal of the MOS transistor—of the N-channel type in FIG. 4—to the intermediate tap of the divider, is effective to prevent the control terminal of the transistor from being discharged at a time when this is undesired.

The diode D4, connecting the resistors R7 and R2, functions to make unidirectional the flow of current from the drain terminal of the MOS transistor.

A first principle on which the driver circuit of this invention operates is to cause the turning on of the MOS transistor to be delayed by utilizing the time-wise pattern of the circuit input signal, rather than generating a delay within the circuit itself.

The basic idea is one of using a threshold type of circuit element and arranging for no current flow toward or from— according to the type of MOS transistor—the control terminal, until the circuit input voltage exceeds a predetermined value. This can be achieved, for example, by coupling a Zener diode DI in series to the control terminal, as in the embodiment of FIG. 4. Where the input signal is of a kind which increases with a degree of uniformity, the time required to exceed that threshold will correspond to the desired amount of delay. In this way, the driver circuit can be matched to the dynamic range of the input signal automatically.

A second principle on which the driver circuit of this invention operates is to have the MOS transistor turned off by using a different conduction path from the turn-on path.

The basic idea is to cause at least one junction, coupled between the circuit input and the control terminal, to be turned on. The circuit of FIG. 4 uses two junctions, coupled serially together, which correspond to the transistors TR1 and TR2.

Where this junction belongs to a bipolar transistor, such as the transistor TR1 in FIG. 4, it can be of advantage if its main conduction path couples the control terminal and source terminal together. In this way, the MOS transistor would be turned off rapidly through a low-impedance conduction path and while seeing a very low fixed potential, i.e. the ground potential. The turn-off speed is also tied to the gain of the bipolar transistor TR1.

The above junctions belong to the first turn-off circuit OFF1, since their conduction is activated directly by changes in potential at the input of the driver circuit.

Advantageously, the second turn-off circuit OFF2 can be inserted in the driver circuit for faster turning off, its conduction being activated by the first turn-off circuit OFF1.

The second circuit OFF2 includes a third transistor, such as the transistor TR3 in FIG. 4, which has a main conduction path coupling the control and source terminals together and is controlled to the on state by a first bipolar transistor of the first circuit OFF1, such as the transistor TR1 in FIG. 4, through its main conduction path. In this way, the MOS transistor can be rapidly turned off while seeing a very low fixed potential, i.e. the ground potential and through a conduction path having a very low impedance if the third transistor is brought to a state of deep conduction by the first transistor.

When the first and third transistors are connected to form an SCR device, as shown in FIG. 4, the turn-off effect that results from its activation will not be limited by the evolution pattern of the circuit input signal, and is practically instantaneous.

In further detail and with reference to FIG. 4, the driver circuit is comprised of the following.

The terminal G is connected to a first terminal of a resistor R3 which has a second terminal connected to the cathode of the Zener diode D1. The anode of the diode D1 is connected to the anode of a junction diode D3 having its cathode connected to the control terminal of the transistor M2. The combination of these elements provides an embodiment of the circuit ON1.

The anode of the diode D1 is also connected to the anode of a junction diode D2 having its cathode connected to the emitter of the PNP-type transistor TR2 whose collector is connected to the terminal S and whose base is connected to the resistor R1. The transistor TR1, of the PNP type, has its emitter connected to the control terminal of the transistor M2, its collector connected to the terminal S via a resistor R5, and its base connected to the emitter of the transistor TR2. A resistor R4 is connected across the emitter and base terminals of the transistor TR1. The combination of these elements provides an embodiment of the circuit OFF1.

The transistor TR3, of the NPN type, has its emitter connected to the terminal S, its collector connected to the base of the transistor TR1, and its base connected to the collector of the transistor TR1. The combination of these elements provides an embodiment of the circuit OFF2.

A transistor TR4 of the NPN type is also provided which has its collector connected to the collector of the transistor TR1, its emitter connected to the terminal S, and its base connected to the terminal G via a resistor R6. All this, in combination with the diodes D2 and D3, is effective to prevent the SCR device from being turned on when this is not desired.

With the driver and start up circuits (DN, SN) associated together in the circuit of FIG. 4, account may be taken of their mutual influence in selecting the parameters for the circuit elements as well as in certain topology options. For example, the resistive value of the resistor R2 may be selected such that, upon turning on, the transistors TR1 and TR2 will not enter conduction, or the resistive divider of the start up circuit may have, additionally to an intermediate tap for the control terminal of the MOS transistor, another intermediate tap corresponding to a node included between the resistor R1 and the resistor R2 for driving the transistor TR2.

Advantageously, circuitry like that just described can be integrated on a single chip and inserted into a package provided with but three terminals, G, S and D.

A transistor such as that described above can be used to advantage in a self-oscillating bridge converter, whether of the full or half-bridge type, specifically of a near-resonant type. A converter such as this has several applications, including driver arrangements for fluorescent lamps.

A transistor of the kind described above may also be used to advantage in a generic driver arrangement for fluorescent lamps.

Figure 5:
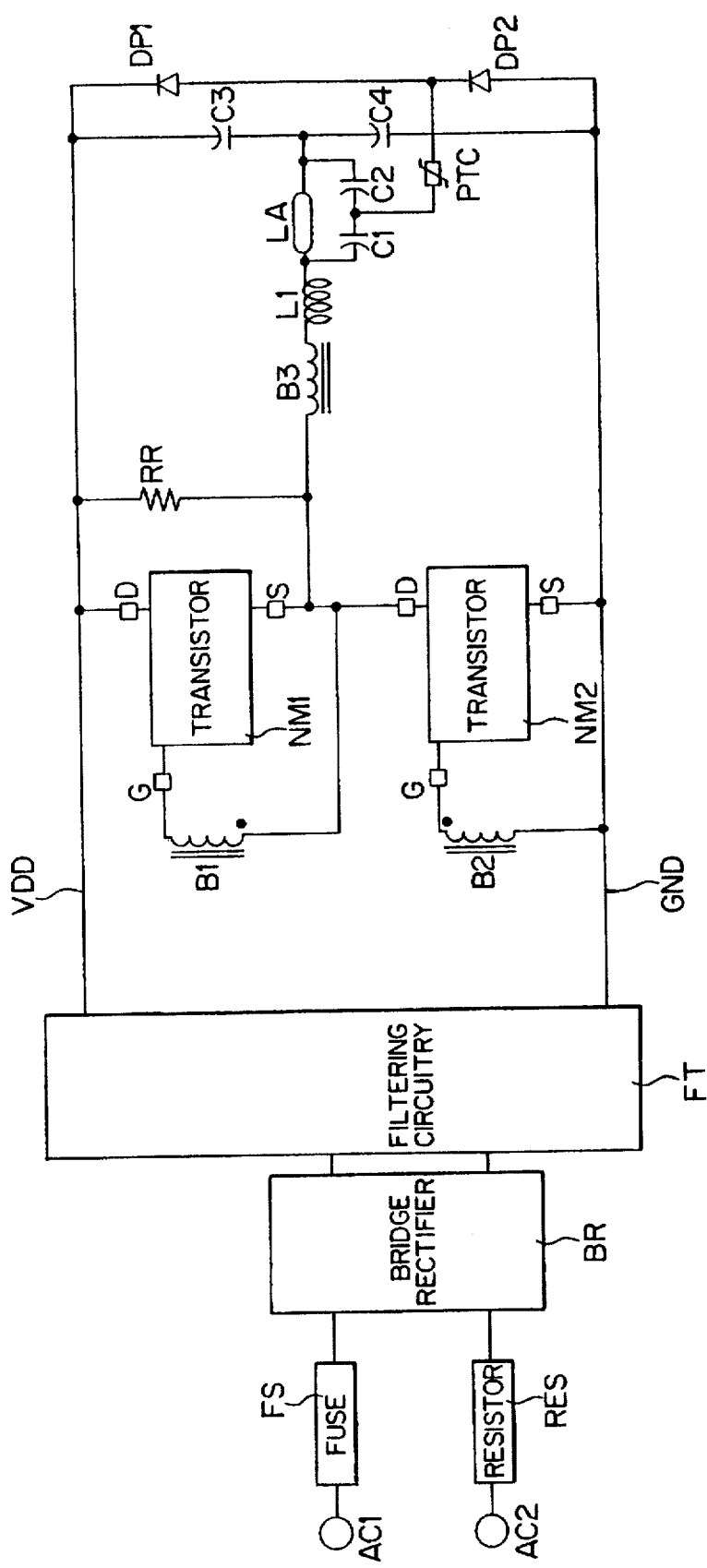
FIG. 5 illustrates a driver arrangement for fluorescent lamps which includes a self-oscillating bridge converter, both of which are in accordance with an embodiment of this invention.

Shown in FIG. 5 is a driver arrangement for fluorescent lamps which comprises a self-oscillating bridge converter, both being in accordance with an embodiment of this invention.

Figure 1:
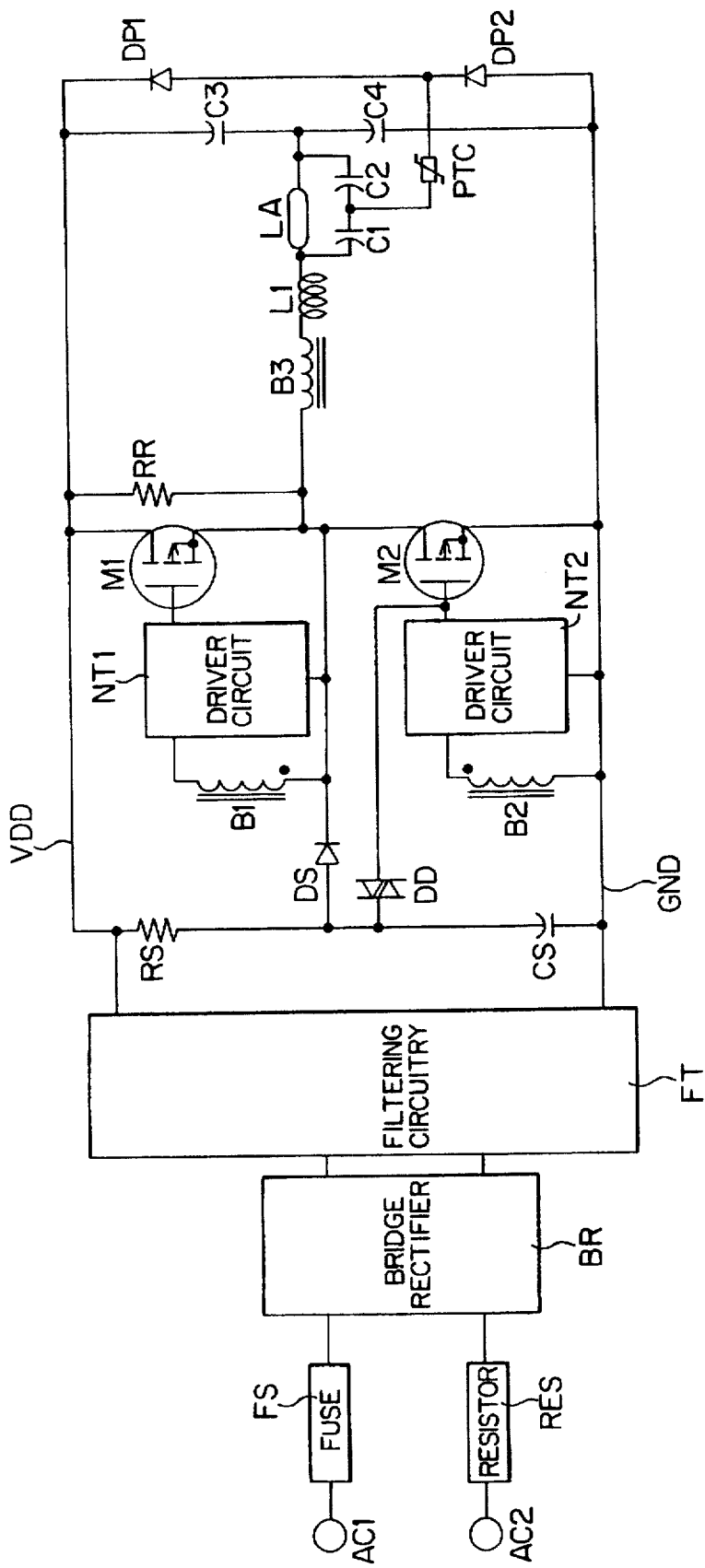
FIG. 1 illustrates a driver arrangement for fluorescent lamps which includes a self-oscillating bridge converter, both of which are conventional.
Figure 2:
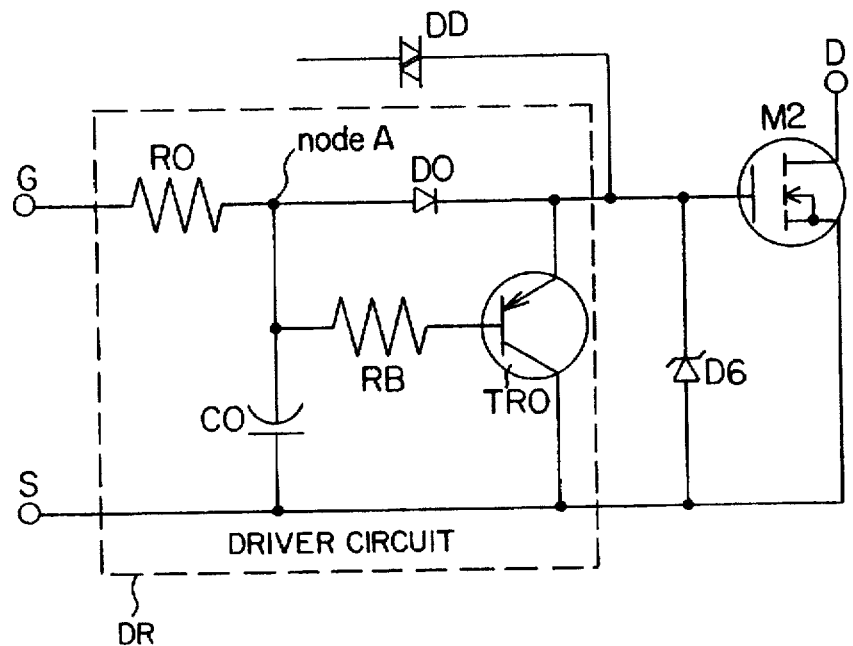
FIG. 2 is a circuit diagram of a conventional driver circuit usable with the converter of FIG. 1.

The arrangement in FIG. 5 is similar to the arrangement in FIG. 1, but comprises a half-bridge composed of a first transistor NM1 and a second transistor NM2, both in accordance with this invention. The terminal D of the transistor NM1 is connected to the terminal VDD, the terminal S of the transistor NM1 is connected to the terminal D of the transistor NM2, and the terminal S of the transistor NM2 is connected to the terminal GND. The secondary windings B1 and B2 are connected across the terminals G and S of the transistors NM1 and NM2, respectively.

Also provided is a resistor RR which is connected across the terminals D and S of the transistor NM1. This resistor allows the output potential of the half-bridge to be set at the system power-on which potential will be fairly high, e.g. not far below the potential at the terminal VDD.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. A start up circuit for a MOS transistor having a drain terminal and a control terminal, the start up circuit comprising an electrical network adapted to couple the drian terminal of the MOS transistor to the control terminal of the MOS transistor.

2. The start up circuit of claim 1, in combination with the MOS transistor that further includes a source terminal, a second MOS transistor having a source terminal, a control terminal, and a drain terminal, wherein:
   the drain terminal of the MOS transistor receives a first power signal;
   the drain terminal of the second MOS transistors receives a second power signal;
   the source terminal of the MOS transistor is coupled to the drain terminal of the second MOS transistor; and
   the control terminal of the MOS transistor is coupled to the control terminal of the second MOS transistor, to form a self-oscillating bridge converter.

3. The start up circuit of claim 1, in combination with the MOS transistor and a fluorescent lamp, wherein the drain terminal of the MOS transistor receives an input power signal and a source terminal of the MOS transistor provides controlled power to the florescent lamp.

4. The start up circuit of claim 1, wherein the MOS transistor further includes a source terminal, the start up circuit further comprising a first turn off circuit having an input terminal, a first terminal coupled to the control terminal of the MOS transistor, and a second terminal coupled to the source terminal of the MOS transistor, the first turn off circuit coupling the source terminal of the MOS transistor to the control terminal of the MOS transistor in response to a signal at the input terminal.

5. The start up circuit of claim 4, further comprising a second turn off circuit that couples the source terminal of the MOS transistor to the control terminal of the MOS transistor in response to the signal at the input terminal of the first turn off circuit.

6. The start up circuit of claim 1, in combination with the MOS transistor.

7. The start up circuit of claim 6, in further combination with a threshold driver circuit coupled to the control terminal of the MOS transistor.

8. The start up circuit of claim 7, wherein the MOS transistor, the electrical network, and the threshold driver circuit are disposed in an integrated form as a single chip having an external gate terminal, an external drain terminal, and an external source terminal.

9. The start up circuit of claim 6, wherein the MOS transistor and the electrical network are disposed in an integrated form as a single chip having an external gate terminal, and external drain terminal, and an external source terminal.

10. The start up circuit of claim 1, wherein the electrical network includes a resistive divider having a first end terminal coupled to the drain terminal of the MOS transistor and an intermediate tap coupled to the control terminal of the MOS transistor.

11. The start up circuit of claim 10, further comprising at least one unidirectional conduction circuit element arranged to make a flow of current within the electrical network to be unidirectional.

12. The start up circuit of claim 10, wherein:
   the MOS transistor further includes a source terminal; and
   the resistive divider further includes a second end terminal coupled to the source terminal of the MOS transistor.

13. The start up circuit of claim 10, further comprising an input terminal coupled to the control terminal;
   wherein the second end terminal of the resistive divider is coupled to the input terminal.

14. The start up circuit of claim 10, further comprising a unidirectional conduction circuit element that couples the intermediate tap of the resistive divider to the control terminal of the MOS transistor.

15. The start up circuit of claim 10, wherein the resistive divider includes at least one unidirectional conduction circuit element arranged to make a flow of current within the resistive divider to be unidirectional.

16. The start up circuit of claim 10, in combination with the MOS transistor, wherein the MOS transistor and the electrical network are disposed in an integrated form as a single chip having an external gate terminal coupled to a second end terminal of the resistive divider, an external drain terminal coupled to the drain terminal of the MOS transistor, and an external source terminal coupled to a source terminal of the MOS transistor.

17. A method for controlling a MOS transistor having a gate terminal and a drain terminal, the method comprising the steps of:
   detecting when a voltage at the drain terminal is greater than a predetermined value; and
   activating the MOS transistor when the voltage at the drain terminal is greater than the predetermined value.

18. The method of claim 17, wherein the step of activating includes activating the MOS transistor until the voltage at the drain terminal is no longer greater than the predetermined value.

19. The method of claim 17, further comprising the steps of:

receiving an input control signal; and activating the MOS transistor in response to the input control signal.

20. The method of claim 17, wherein the step of activating includes injecting current into the gate terminal.

21. The method of claim 17, wherein the MOS transistor further includes a source terminal, the method further comprising the steps of:

detecting when an input signal is indicative of a turn off condition; and coupling the source terminal of the MOS transistor to the control terminal of the MOS transistor in response to the input signal being indicative of the turn off condition.

22. The method of claim 21, wherein the step of coupling includes the steps of:

providing a first electrical connection between the source terminal of the MOS transistor and the control terminal of the MOS transistor; and providing a second electrical connection between the source terminal of the MOS transistor and the control terminal of the MOS transistor.

23. The method of claim 17, wherein the step of detecting includes the steps of:

dividing the voltage at the drain terminal by a predetermined factor to provide a divided voltage; and comparing the divided voltage to a second predetermined value.

24. The method of claim 23, wherein:

the MOS transistor further includes a source terminal; and the step of dividing includes dividing the voltage at the drain terminal with respect to a voltage at the source terminal.

25. The method of claim 24, wherein the step of dividing the voltage at the drain terminal with respect to the voltage at the source terminal includes the steps of:

conducting current from the drain terminal to the source terminal when the voltage at the drain terminal is greater than the voltage at the source terminal; and blocking current from flowing from the source terminal to the drain terminal when the voltage at the drain terminal is not greater than the voltage at the source terminal.

26. The method of claim 23, further comprising the steps of:

receiving an input control signal at an input terminal; and activating the MOS transistor in response to the input control signal;

wherein the step of dividing includes dividing the voltage at the drain terminal with respect to a voltage at the input terminal.

27. The method of claim 26, wherein the step of dividing the voltage at the drain terminal with respect to the voltage at the input terminal includes the steps of:

conducting current from the drain terminal to the input terminal when the voltage at the drain terminal is greater than the voltage at the input terminal; and blocking current from flowing from the input terminal to the drain terminal when the voltage at the drain terminal is not greater than the voltage at the input terminal.

28. The method of claim 17, further including a step of preventing the drain terminal from discharging through a path external to the MOS transistor.

29. The method of claim 17, wherein:

the step of detecting includes a step of dividing the voltage at the drain terminal by a predetermined factor to provide a divided voltage; and the step of activating includes applying the divided voltage to the gate terminal.

30. The method of claim 29, wherein:

the MOS transistor further includes a source terminal; and the step of dividing includes dividing the voltage at the drain terminal with respect to a voltage at the source terminal.

31. The method of claim 30, wherein the step of dividing the voltage at the drain terminal with respect to the voltage at the source terminal includes the steps of:

conducting current from the drain terminal to the source terminal when the voltage at the drain terminal is greater than the voltage at the source terminal; and blocking current from flowing from the source terminal to the drain terminal when the voltage at the drain terminal is not greater than the voltage at the source terminal.

32. The method of claim 29, further comprising the steps of:

receiving an input control signal at an input terminal; and activating the MOS transistor in response to the input control signal;

wherein the step of dividing includes dividing the voltage at the drain terminal with respect to a voltage at the input terminal.

33. The method of claim 32, wherein the step of dividing the voltage at the drain terminal with respect to the voltage at the input terminal includes the steps of:

conducting current from the drain terminal to the input terminal when the voltage at the drain terminal is greater than the voltage at the input terminal; and blocking current from flowing from the input terminal to the drain terminal when the voltage at the drain terminal is not greater than the voltage at the input terminal.

34. An apparatus for controlling a MOS transistor having a gate terminal and a drain terminal, the apparatus comprising:

means for detecting when a voltage at the drain terminal is greater than a predetermined value; and means for activating the MOS transistor when the voltage at the drain terminal is greater than the predetermined value.

35. The apparatus of claim 34, wherein the means for activating includes means for activating the MOS transistor until the voltage at the drain terminal is no longer greater than the predetermined value.

36. The apparatus of claim 34, further comprising:

means for receiving an input control signal; and means for activating the MOS transistor in response to the input control signal.

37. The apparatus of claim 34, wherein the means for activating includes means for injecting current into the gate terminal.

38. The apparatus of claim 34, further including means for preventing the drain terminal from discharging through a path external to the MOS transistor.

39. The apparatus of claim 34, wherein the MOS transistor further includes a source terminal, the apparatus further comprising:

means for detecting when an input signal is indicative of a turn off condition; and means for coupling the source terminal of the MOS transistor to the control terminal of the MOS transistor in response to the input signal being indicative of the turn off condition.

40. The apparatus of claim 39, wherein the means for coupling includes:
   means for providing a first electrical connection between the source terminal of the MOS transistor and the control terminal of the MOS transistor; and
   means for providing a second electrical connection between the source terminal of the MOS transistor and the control terminal of the MOS transistor.

41. The apparatus of claim 34, wherein the means for detecting includes:
   means for dividing the voltage at the drain terminal by a predetermined factor to provide a divided voltage; and
   means for comparing the divided voltage to a second predetermined value.

42. The apparatus of claim 41, wherein:
   the MOS transistor further includes a source terminal; and
   the means for dividing includes means for dividing the voltage at the drain terminal with respect to a voltage at the source terminal.

43. The apparatus of claim 42, wherein the means for dividing the voltage at the drain terminal with respect to the voltage at the source terminal includes:
   means for conducting current from the drain terminal to the source terminal when the voltage at the drain terminal is greater than the voltage at the source terminal; and
   means for blocking current from flowing from the source terminal to the drain terminal when the voltage at the drain terminal is not greater than the voltage at the source terminal.

44. The apparatus of claim 41, further comprising:
   means for receiving an input control signal at an input terminal; and
   means for activating the MOS transistor in response to the input control signal;
   wherein the means for dividing includes means for dividing the voltage at the drain terminal with respect to a voltage at the input terminal.

45. The apparatus of claim 44, wherein the means for dividing the voltage at the drain terminal with respect to the voltage at the input terminal includes:
   means for conducting current from the drain terminal to the input terminal when the voltage at the drain terminal is greater than the voltage at the input terminal; and
   means for blocking current from flowing from the input terminal to the drain terminal when the voltage at the drain terminal is not greater than the voltage at the input terminal.

46. The apparatus of claim 34, wherein:
   the means for detecting includes means for dividing the voltage at the drain terminal by a predetermined factor to provide a divided voltage; and
   the means for activating includes means for applying the divided voltage to the gate terminal.

47. The apparatus of claim 46, wherein:
   the MOS transistor further includes a source terminal; and
   the means for dividing includes means for dividing the voltage at the drain terminal with respect to a voltage at the source terminal.

48. The apparatus of claim 47, wherein the means for dividing the voltage at the drain terminal with respect to the voltage at the source terminal includes:
   means for conducting current from the drain terminal to the source terminal when the voltage at the drain terminal is greater than the voltage at the source terminal; and
   means for blocking current from flowing from the source terminal to the drain terminal when the voltage at the drain terminal is not greater than the voltage at the source terminal.

49. The apparatus of claim 46, further comprising:
   means for receiving an input control signal at an input terminal; and
   means for activating the MOS transistor in response to the input control signal;
   wherein the means for dividing includes means for dividing the voltage at the drain terminal with respect to a voltage at the input terminal.

50. The apparatus of claim 49, wherein the means for dividing the voltage at the drain terminal with respect to the voltage at the input terminal includes:
   means for conducting current from the drain terminal to the input terminal when the voltage at the drain terminal is greater than the voltage at the input terminal; and
   means for blocking current from flowing from the input terminal to the drain terminal when the voltage at the drain terminal is not greater than the voltage at the input terminal.

51. A circuit for controlling a MOS transistor having a drain terminal and a gate terminal, the circuit comprising:
   a first terminal coupled to the drain terminal, the first terminal receiving a voltage at the drain terminal;
   a second terminal, coupled to the gate terminal; and
   control circuitry, coupled to the first terminal and the second terminal that activates the MOS transistor through the second terminal when the voltage at the drain terminal is greater than a predetermined value.

52. The circuit of claim 51, further comprising a diode that couples the second terminal to the gate terminal, the diode preventing discharge of the gate terminal through the circuit.

53. The circuit of claim 51, in combination with the MOS transistor.

54. The circuit of claim 51, in combination with the MOS transistor that further includes a source terminal, a second MOS transistor having a source terminal, a gate terminal, and a drain terminal, wherein:
   the drain terminal of the MOS transistor receives a first power signal;
   the drain terminal of the second MOS transistor receives a second power signal;
   the source terminal of the MOS transistor is coupled to the source terminal of the second MOS transistor; and
   the gate terminal of the MOS transistor is coupled to the gate terminal of the second MOS transistor, to form a self-oscillating bridge converter.

55. The circuit of claim 51, in combination with the MOS transistor and a fluorescent lamp, wherein the drain terminal of the MOS transistor receives an input power signal and a source terminal of the MOS transistor provides controlled power to the florescent lamp.

56. The circuit of claim 51, wherein the MOS transistor further includes a source terminal, the circuit further comprising a first turn off circuit having an input terminal, a first terminal coupled to the control terminal of the MOS transistor, and a second terminal coupled to the source terminal of the MOS transistor, the first turn off circuit coupling the source terminal of the MOS transistor to the control terminal of the MOS transistor in response to a signal at the input terminal.

57. The circuit of claim 56, further comprising a second turn off circuit that couples the source terminal of the MOS transistor to the control terminal of the MOS transistor in response to the signal at the input terminal of the first turn off circuit.

58. The circuit of claim 45, wherein the control circuitry includes a voltage divider having a first end coupled to the first terminal, and an intermediate tap coupled to the second terminal.

59. The circuit of claim 58, further comprising an input terminal coupled to the gate terminal, and wherein the voltage divider further includes a second end coupled to the input terminal.

60. The circuit of claim 58, wherein the voltage divider includes a series mounted diode that allows current to flow in the voltage divider in only a single direction.

61. The circuit of claim 46, wherein:
the MOS transistor further includes a source terminal; and
the voltage divider further includes a second end coupled to the source terminal.

62. The circuit of claim 47, in combination with the MOS transistor, wherein:
the MOS transistor and the circuit are disposed in an integrated form as a single chip having an external gate terminal coupled to a second end of the voltage divider, an external drain terminal coupled to the drain terminal of the MOS transistor, and an external source terminal coupled to the source terminal of the MOS transistor.

* * * * *

(12) EX PARTE REEXAMINATION CERTIFICATE (7036th)
United States Patent
Palara et al.

(10) Number: US 5,712,776 C1
(45) Certificate Issued: Sep. 1, 2009

(54) STARTING CIRCUIT AND METHOD FOR STARTING A MOS TRANSISTOR

(75) Inventors: Sergio Palara, Acitrezza (IT); Vito Graziano, Palermo (IT)

(73) Assignees: SGS-Thomson Microelectronics S.R.L., Agrate Brianza (IT); Consorzio Per La Ricerca Sulla Microelecttronica Nel Mezzogiorno, Catania (IT)

Reexamination Request:
No. 90/007,625, Jul. 12, 2005

Reexamination Certificate for:
Patent No.: 5,712,776
Issued: Jan. 27, 1998
Appl. No.: 08/688,296
Filed: Jul. 30, 1996

(30) Foreign Application Priority Data
Jul. 31, 1995 (EP) .............................. 95830340

(51) Int. Cl.
*H02M 1/00* (2006.01)

(52) U.S. Cl. .................. 363/49; 363/56.5; 315/307; 327/434

(58) Field of Classification Search .......... 327/374–377, 327/389, 427, 430–431, 434, 437, 442, 108, 327/112, 399
See application file for complete search history.

(56) References Cited

U.S. PATENT DOCUMENTS

| | | | |
|---|---|---|---|
| 4,045,688 A | 8/1977 | Stewart | |
| 4,818,904 A | 4/1989 | Kobayashi | |
| 4,931,676 A | 6/1990 | Baiocchi et al. | |
| 4,956,618 A | 9/1990 | Ulmer | |
| 5,079,608 A | * 1/1992 | Wodarczyk et al. | 257/355 |
| 5,151,614 A | 9/1992 | Yamazaki et al. | |
| 5,343,192 A | 8/1994 | Yenisey | |
| 5,352,932 A | * 10/1994 | Tihanyi | 327/109 |
| 5,444,591 A | 8/1995 | Chokhawala et al. | |
| 5,828,244 A | * 10/1998 | Palara et al. | 327/108 |

FOREIGN PATENT DOCUMENTS

| | | |
|---|---|---|
| EP | 0 330 823 A3 | 9/1989 |
| EP | 0 330 823 A2 | 9/1989 |
| EP | 0 330 823 B1 | 5/1995 |
| JP | 55047727 A | 4/1980 |
| JP | 61189705 A | 8/1986 |
| JP | 62293328 A | 12/1987 |
| JP | 63163519 A | 7/1988 |
| JP | 03252093 A | 11/1991 |
| JP | 06196988 A | 7/1994 |
| KR | 1995-0014152 B1 | 11/1995 |
| WO | 94/27420 A1 | 11/1994 |

OTHER PUBLICATIONS

Dunn, William, "Driving and Protection of High Side NMOS Power Switches", IEEE Transactions On Industry Applications, Jan./Feb. 1992, vol. 28, Issue 1, pp. 26–30.

* cited by examiner

*Primary Examiner*—My-Trang Ton

(57) ABSTRACT

A start up circuit causes a MOS transistor to be turned on by sensing local electrical quantities thereof, specifically the potential at the drain terminal of the MOS transistor. A small current is injected into the control terminal of the MOS transistor when the potential at the drain terminal is high. For the purpose, an electric network is arranged to couple these two terminals together.

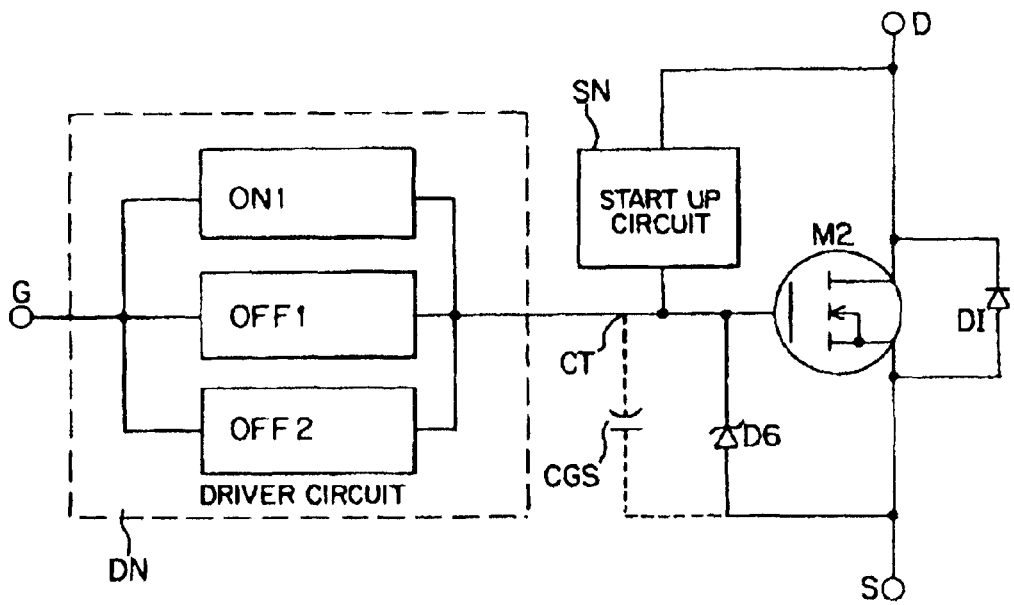

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–62 are cancelled.

New claims 63–68 are added and determined to be patentable.

63. *A start up circuit for a MOS transistor having a drain terminal and a control terminal in combination with MOS transistor, the start up circuit comprising:*

*an electrical network adapted to couple the drain terminal of the MOS transistor to the control terminal of the MOS transistor wherein the MOS transistor and the electrical network are disposed in an integrated form as a single chip having only an external gate terminal, an external drain terminal, and an external source terminal;*

*a turn on circuit coupled between the external gate terminal and the control terminal of the MOS transistor; and*

*a turn off circuit coupled between the external gate terminal and the control terminal of the MOS transistor.*

64. *A method for controlling a MOS transistor having a control terminal, a drain terminal and a source terminal, the method comprising the steps of:*

*detecting when a voltage at the drain terminal is greater than a predetermined value;*

*activating the MOS transistor when the voltage at the drain terminal is greater then the predetermined value;*

*detecting when an input signal is indicative of a turn off condition; and*

*coupling the source terminal of the MOS transistor to the contol terminal of the MOS transistor in response to the input signal being indicative of the turn off condition, wherein the step of coupling includes the steps of:*

*providing a first electrical connection between the source terminal of the MOS transistor and the control terminal of the MOS transistor; and*

*providing a second electrical connection between the source terminal of the MOS transistor and the control terminal of the MOS transistor.*

65. *A method for controlling a MOS transistor having a gate terminal and a drain terminal, the method comprising the steps of:*

*detecting when a voltage at the drain terminal is greater than a predetermined value;*

*activating the MOS transistor when the voltage at the drain terminal is greater than the predetermined value; and*

*preventing the drain terminal from discharging through first and second paths external to the MOS transistor.*

66. *An apparatus for controlling a MOS transistor having a gate terminal, a drain terminal and a source terminal, the apparatus comprising:*

*means for detecting when a voltage at the drain terminal is greater than a predetermined value;*

*means for activating the MOS transistor when the voltage at the drain terminal is greater than the predetermined value;*

*means for detecting when an input signal is indicative of a turn off condition; and*

*means for coupling the source terminal of the MOS transistor to the control terminal of the MOS transistor in response to the input signal being indicative of the turn off condition, wherein the means for coupling includes:*

*means for providing a first electrical connection between the source terminal of the MOS transistor and the control terminal of the MOS transistor; and*

*means for providing a second electrical connection between the source terminal of the MOS transistor and the control terminal of the MOS transistor.*

67. *A circuit for controlling a MOS transistor having a drain terminal, a gate terminal and a source terminal, the circuit comprising:*

*a first terminal coupled to the drain terminal, the first terminal receiving a voltage at the drain terminal;*

*a second terminal coupled to the gate terminal;*

*control circuitry coupled to the first terminal and a control terminal that activates the MOS transistor through the control terminal when the voltage at the drain terminal is greater than a predetermined value;*

*a first turn off circuit having an input terminal; and*

*a second turn off circuit, wherein the first turn off circuit couples the source terminal of the MOS transistor to the control terminal of the MOS transistor in response to a signal at the input terminal and the second turn off circuit couples the source terminal of the MOS transistor to the control terminal of the MOS transistor in response to the signal at the input terminal of the first turn off circuit.*

68. *The start up circuit of claim 63, wherein the external gate terminal, the external drain terminal, and the external source terminal are terminals of a package including a single chip.*

* * * * *